United States Patent [19]
Peters

[11] Patent Number: 5,812,571
[45] Date of Patent: Sep. 22, 1998

[54] HIGH-POWER VERTICAL CAVITY SURFACE EMITTING LASER CLUSTER

[75] Inventor: Frank H. Peters, Lompoc, Calif.

[73] Assignee: W. L. Gore & Associates, Inc., Newark, Del.

[21] Appl. No.: 739,108

[22] Filed: Oct. 25, 1996

[51] Int. Cl.⁶ .................. H01S 3/04; H01S 3/08; H01S 3/093; G02B 6/36
[52] U.S. Cl. ................ 372/36; 372/96; 372/72; 372/45; 385/89; 437/129
[58] Field of Search .................. 372/36, 45, 50, 372/96, 72, 75; 385/88–94; 437/129; 359/154; 219/540

[56] References Cited

U.S. PATENT DOCUMENTS

| | | | |
|---|---|---|---|
| 3,748,439 | 7/1973 | Ting et al. | 219/540 |
| 4,386,821 | 6/1983 | Simon et al. | 385/94 |
| 5,016,083 | 5/1991 | Ishii et al. | 372/36 |
| 5,081,637 | 1/1992 | Fan et al. | 372/72 |
| 5,359,447 | 10/1994 | Hahn et al. | 359/154 |
| 5,394,423 | 2/1995 | Kasahara | 372/45 |
| 5,412,680 | 5/1995 | Swirhun et al. | 372/50 |
| 5,434,939 | 7/1995 | Matsuda | 385/88 |
| 5,473,716 | 12/1995 | Lebby et al. | 385/88 |

FOREIGN PATENT DOCUMENTS

| | | | |
|---|---|---|---|
| 63-136003 | 6/1988 | Japan | 385/89 |
| 2-138785 | 5/1990 | Japan | 372/36 |

Primary Examiner—Rodney B. Bovernick
Assistant Examiner—Luong-Quyen T. Phan
Attorney, Agent, or Firm—Victor M. Genco, Jr.

[57] ABSTRACT

A laser cluster for high-power applications includes an array of VCSELs. The array of VCSELs includes a center VCSEL and one or more peripheral VCSELs displaced from the center VCSEL in a hexagonal closest-packing arrangement sharing a pair of common electrical contacts. Each VCSEL in the array is flip-chip mounted on a heat sink to present the backside of the VCSEL. A multimode optical fiber is coupled to receive laser light from the array of VCSELs. The array of VCSELs is operable to generate a laser burst at a wavelength in a range from 950 nm to 1050 nm. In a process for fabricating a VCSEL that can be clustered for high-power applications, a bottom n-doped mirror stack is deposited above an n-doped gallium arsenide substrate. An active region including indium gallium arsenide is deposited above the bottom mirror stack. A top p-doped mirror stack is deposited above the active region. Electrical contacts are applied to the top mirror stack and to the substrate. The laser cluster is packaged and sealed.

13 Claims, 5 Drawing Sheets

HIGH-POWER VERTICAL CAVITY SURFACE EMITTING LASER CLUSTER

FIELD OF THE INVENTION

This invention relates generally to vertical cavity surface emitting lasers, and more particularly to closely-spaced arrays of vertical cavity surface emitting lasers useful for high-power applications.

BACKGROUND OF THE INVENTION

Vertical cavity surface emitting lasers (VCSELs) have a wide variety of applications including optical interconnection of integrated circuits, optical computing systems, optical recording and readout systems, and telecommunications. VCSELs have many advantages over edge-emitting lasers, including the possibility of wafer-scale fabrication and testing, and the possibility of forming one and two-dimensional arrays of the vertically-emitting devices. The circular nature of the light output beams from VCSELs makes them ideally suited for coupling to optical fibers.

Referring to FIG. 1, a conventional VCSEL includes a bottom mirror stack 20 deposited above a compound semiconductor substrate 22. The bottom mirror stack is a system of epitaxially-grown compound semiconductor layers forming a distributed Bragg reflector (DBR). A top mirror stack 24, which is likewise a system of epitaxially-grown compound semiconductor layers forming a DBR, is deposited above the bottom mirror stack. An active region 26 is interposed between the mirror stacks. These elements form a resonant optical cavity having a central vertical axis 28 perpendicular to the surface of the semiconductor substrate on which the VCSEL is fabricated.

The compound semiconductor (typically III–V or II–VI) composition, layer thickness, and number of high-refractive index and low-refractive index semiconductor layers in the mirror stacks are selected to provide a high reflectivity over a wavelength range of the coherent electromagnetic radiation generated in the active region, with the wavelength range preferably being matched to a gain spectrum of the active region at an operating temperature range for the VCSEL. The layer thicknesses have an effective optical thickness that is about one-quarter of the fundamental wavelength of the coherent light generated in the active region. The reflectivities of the mirror stacks are defined during epitaxial growth of the VCSEL by adjusting the number of mirror periods in each mirror stack.

In the bottom-emitting VCSEL shown in FIG. 1, the number of mirror periods in bottom mirror stack 20 is less than in top mirror stack 24, reducing the reflectivity of the bottom mirror stack, which allows light emission, as shown by arrow 30, from the bottom surface of substrate 22. The top mirror stack has an opposite doping type with respect to the substrate and the bottom mirror stack.

VCSELs provide a safe, reliable, testable and cost-effective ordinance ignition mechanism. Optical power from a VCSEL is useful for such high-power applications because the approximately circular emitting facet of the VCSEL is shaped like the circular end of the core of an optical fiber, and the diffraction driven output divergence is well within the acceptance angle of practical optical fibers. This provides fiber coupling efficiency in excess of ninety percent. Optical initiation of ordinance ignition provides increased safety by being essentially impervious to electromagnetic interference.

Even though VCSELs have many advantages over existing diode lasers and are much less expensive to produce, VCSELs have not been extensively used for high-power applications because of the thermal characteristics of VCSELs. VCSELs become heated according to the surface area of the emitting facet and produce output power according to the diameter of the emitting facet. A large VCSEL is not efficient for high-power applications because it heats exponentially as a function of emitting facet diameter, while delivering output power linearly.

SUMMARY OF THE INVENTION

The invention provides a laser cluster for high-power applications which includes a closely-spaced array of VCSELs arranged to maximize efficiency. The array of VCSELs includes a center VCSEL and one or more peripheral VCSELs displaced from the center VCSEL in a hexagonal closest-packing arrangement sharing a pair of common electrical contacts. Each VCSEL in the array is flip-chip mounted on a heat sink to present the backside (i.e., the bottom of the substrate) of the VCSEL. In an illustrative embodiment, the VCSELs in the array are separated by a distance measured between central vertical axes in a range from 10 mm to 40 mm, and each VCSEL in the array presents an emitting facet having a diameter in a range from 5 mm to 30 mm. A multimode optical fiber is coupled to receive laser light from the closely-spaced commonly-contacted array of VCSELs. The array of VCSELs is operable to generate a laser burst at a wavelength in a range from 950 nm to 1050 nm using an indium gallium arsenide, InGaAs, active region. Bundled multimode optical fibers can be coupled to multiple laser clusters.

An illustrative process for fabricating a VCSEL that can be clustered for high-power applications includes the following steps. A bottom n-doped mirror stack is deposited above an n-doped gallium arsenide, GaAs, substrate. An active region including indium gallium arsenide, InGaAs, is deposited above the bottom mirror stack. A top p-doped mirror stack is deposited above the active region. Electrical contacts are applied to the top mirror stack and to the substrate. The fabricated VCSEL can be electrically-pumped to emit coherent electromagnetic radiation having a wavelength in a range from 950 nm to 1050 nm.

Clustering VCSELs according to the principles of the invention improves operating efficiency in a way that comports with the thermal characteristics of the devices. To further improve operating efficiency, each VCSEL of the array is coupled to a heat sink to dissipate heat from the operating VCSEL into a submount instead of the VCSEL wafer. In this process, a gold-coated heat sink made of a highly thermally conductive substance such as, for example, diamond, beryllium oxide, or aluminum nitride is disposed above a submount (which can be a patterned aluminum nitride substrate). A layer of solder or a layer of electrically and thermally conductive epoxy is applied to the heat sink. Any type of solder that is highly thermally conductive can be used such as, for example, a mixture of gold and tin (which may be in the form of an alloy) or indium. The top mirror stack is thereupon flip-chip bonded to the layer of solder or epoxy.

In a commercial package, the laser cluster is sealed within a housing. The laser cluster includes a closely-spaced array of seven VCSELs, each capable of emitting at a wavelength in a range from 950 nm to 1050 nm, mounted junction-side down on the aluminum nitride, AlN, submount and presenting a backside emitting surface (i.e., the bottom side of the substrate of each VCSEL in the array). Common ground and ignition contacts are electrically connected through the submount to the laser cluster. A metallized multimode optical fiber passes through the housing and is coupled onto the backside emitting surface presented by the closely-spaced array. The fiber core of the metallized multimode optical fiber has a diameter of, for example, 100 mm, and the seven-VCSEL array is positioned in a hexagonal closest-packing arrangement fitting within a 100 mm-diameter circular area which corresponds to the 100 mm diameter of the fiber core. A combined burst of power is possible from the laser cluster.

Other features and advantages of the invention will become apparent from the following detailed description, taken in conjunction with the accompanying drawings, which illustrate, by way of example, the features of the invention.

DETAILED DESCRIPTION OF THE PREFERRED EMBODIMENT

Figure 1:
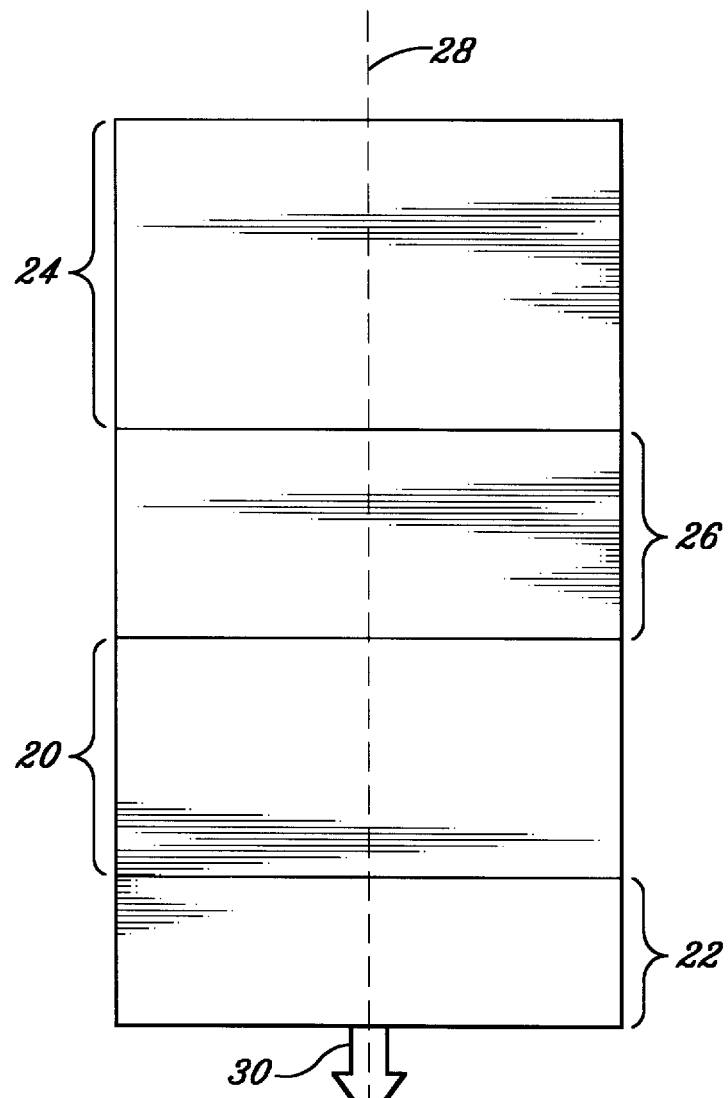
FIG. 1 is an elevational sectional view of a conventional vertical cavity surface emitting laser (VCSEL)

As shown in the drawings for purposes of illustration, a high-power laser cluster includes a closely-spaced array of VCSELs with shared ground and ignition contacts. The laser cluster can produce a large amount of output power while avoiding thermal problems associated with single large-diameter VCSELs. Each VCSEL in the closely-spaced array is small enough to efficiently produce optical power. The relatively large amount of optical power from all the VCSELs is coupled into a multimode optical fiber and is useful for various applications. Clustered VCSELs according to the principles of the invention efficiently produce large amounts of optical power without the problem of overheating present in single large-diameter VCSELs.

The output power of a VCSEL cluster according to the invention scales more like the surface area of the emitting facets of each VCSEL in the array rather than the diameter of the emitting facets of each VCSEL (as would be the case for a single large-diameter VCSEL) so that it is feasible (in terms of efficiency) to take advantage of the greater robustness that larger diameter fibers offer. A plurality of multimode fibers, for example in a bundle, can be coupled to a plurality of VCSEL clusters according to the principles of the invention.

Figure 2:
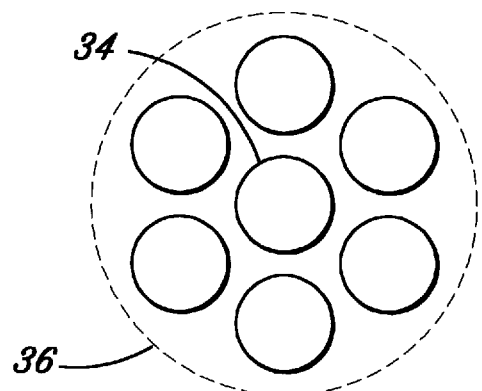
FIG. 2 is a plan view of a laser cluster according to the principles of the invention.

Referring to FIG. 2, a cluster of seven VCSELs having common ignition and ground contacts are positioned in a hexagonal closest-packing arrangement (of peripheral VCSELs around a center VCSEL 34) located within a circular area 36 on a chip. In the hexagonal closest-packing arrangement, six peripheral VCSELs surround center VCSEL 34 and are radially displaced from the central vertical axis of the center VCSEL by a preselected spacing distance. The preferred spacing between central vertical axes of the VCSELs in the cluster is in a range from 10 mm to 40 mm and the preferred diameter of the emitting facet of a VCSEL in the cluster, based on efficient power output per unit facet area and other considerations, is in a range between 5 mm and 30 mm.

Figure 3:
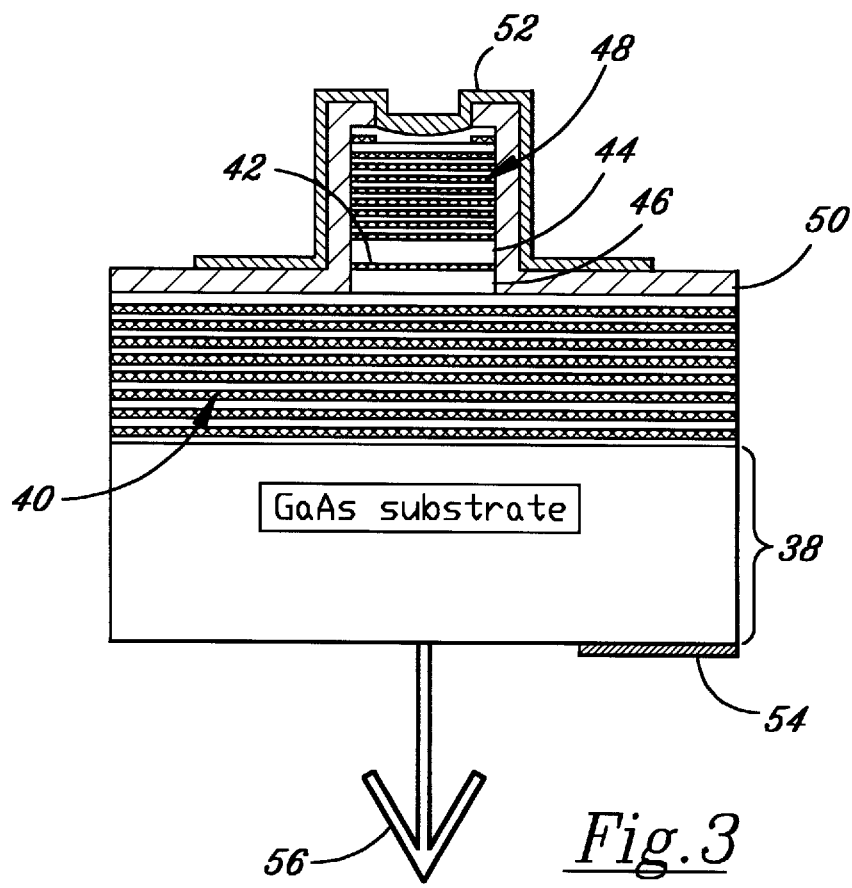
FIG. 3 is an elevational sectional view of a bottom-emitting VCSEL according to the principles of the invention.

An exemplary VCSEL that can be used in a high-power laser cluster according to the invention is shown in FIG. 3. The bottom-emitting VCSEL is typically formed on an n-doped gallium arsenide, GaAs, substrate 38. In the exemplary VCSEL, a bottom n-doped mirror stack 40 is formed above the GaAs substrate. The bottom mirror stack presents a system of alternating layers of GaAs and aluminum arsenide, AlAs, ("a GaAs/AlAs system"), or alternating layers of an AlGaAs alloy with different aluminum compositions, which form a distributed Bragg reflector. An active region 42 including indium gallium arsenide, InGaAs, is deposited above the bottom mirror stack. A pair of claddings 44, 46 sandwich the InGaAs active region 42. A top p-doped mirror stack 48 is deposited above the active region. The top mirror stack presents a GaAs/AlAs system, or a system of alternatng layers of AlGaAs alloys having different aluminum compositions, creating a distributed Bragg reflector.

The top mirror stack and the active region sandwiched by the pair of claddings are vertically etched to the bottom mirror stack to create a mesa above the bottom mirror stack. Such etch-post configuration provides current confinement. Alternatively, an annular ion-implantation region forming a current aperture centered about the central vertical axis of the VCSEL can be used for current confinement.

An insulative layer (of composition $SiN_x$) 50 is disposed above the bottom mirror stack and the mesa. A p-type reflector and contact 52 is applied to insulative layer 50 and to top mirror stack 48. P-type reflector and contact 52 has good adhesion to semiconductor, has good thermal and electrical conductivity, and is a good barrier to solder so that application of solder will not compromise the semiconductor. An exemplary p-type reflector and contact 52 consists essentially of titanium, platinum, and gold, Ti/Pt/Au, (which can be in the form of an alloy or a mixture), or consists essentially of titanium, gold and nickel, TilAu/Ni, (which can be in the form of an alloy or a mixture). An n-type contact 54 for receiving a wire bond is applied to substrate 38. The bottom-emitting VCSEL can be electrically pumped to emit coherent electromagnetic radiation as shown by arrow 56 having a wavelength in the range from 950 nm to 1050 nm.

Figure 4:
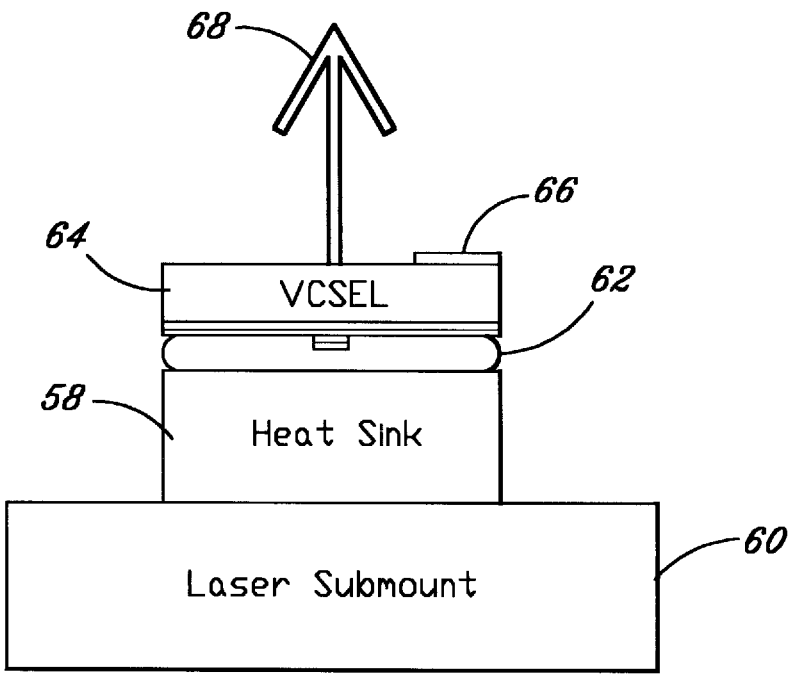
FIG. 4 is an elevational view of the VCSEL depicted in FIG. 3 flip-chip mounted on a heat-sink according to the principles of the invention.

A flip-chip technique can be used for heat-sinking one or more bottom-emitting VCSELs to further increase heat dissipation. Referring to FIG. 4, a gold-coated heat sink 58 is disposed above an aluminum nitride patterned-substrate submount 60. The heat sink can be made of any highly thermally conductive substance such as, for example, diamond, or a beryllium oxide or aluminum nitride carrier. A layer 62 of solder or of electrically and thermally conducting epoxy is applied above the gold-coated heat sink 62. Any type of solder that is highly thermally conductive can be used such as, for example, a mixture of gold and tin (which can be in the form of an alloy) or indium. A VCSEL 64 (such as that shown in FIG. 3) is flipped and bonded, junction (i.e., top mirror stack) side down, on the layer 62 of solder or epoxy. A wire 66 can be bonded to the n-type contact for electrically pumping the VCSEL, or an electrically conductive path through the submount can be used to pump the VCSEL. The flip-chip mounted VCSEL shown in FIG. 4 can emit coherent electromagnetic radiation through its substrate as shown by arrow 68.

VCSELs presenting an emitting facet having a diameter of 20 mm were made and experimentally tested in three arrangements: individual, seven-VCSEL clusters with 20 mm separations, and seven-VCSEL clusters with 40 mm separations. When a laser cluster is fabricated on a wafer according to the principles of the invention without heat-sinking, most of the heat flow from the cluster is into the wafer. The VCSEL cluster generates more heat per VCSEL than would be the case of a single isolated device since each VCSEL affects the performance of the other VCSELs. As a result, a seven-VCSEL cluster without heat-sinking does not produce seven times the output power of the individual VCSELs.

When a VCSEL cluster is not coupled to a heat sink, the amount of optical power produced by the VCSEL cluster from a given input power is proportional to the cluster separation distance. The larger the cluster separation distance, the larger the output optical power from the given input power. This is because a larger separation distance provides better heat dissipation to alleviate the non-optimum heat flow present when the VCSELs are not mounted on a heat sink.

When seven-VCSEL clusters are mounted on a heat sink according to the principles of the invention, most of the heat flow is into the heat sink. As a result, the clusters are able to produce seven times the output power of a single VCSEL, since the heat flow into the wafer is a negligible part of the thermal path and each VCSEL no longer affects the performance of its neighbors.

Figure 5:
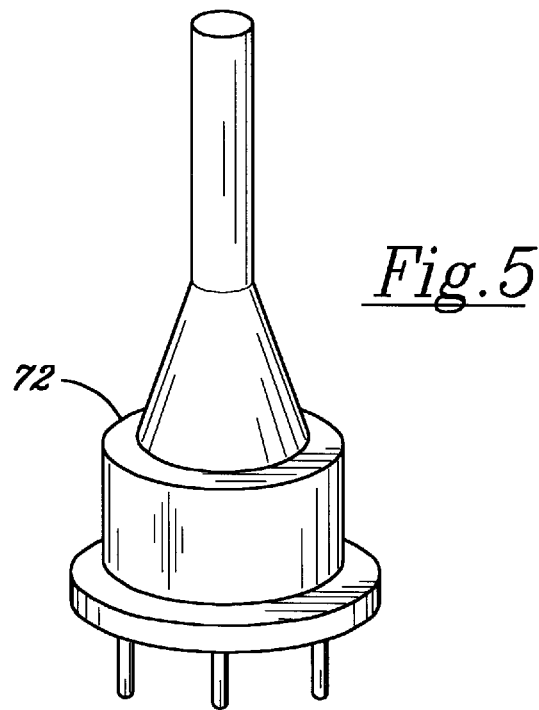
FIG. 5 is a perspective view of a sealed package for a laser cluster according to the principles of the invention.
Figure 6:
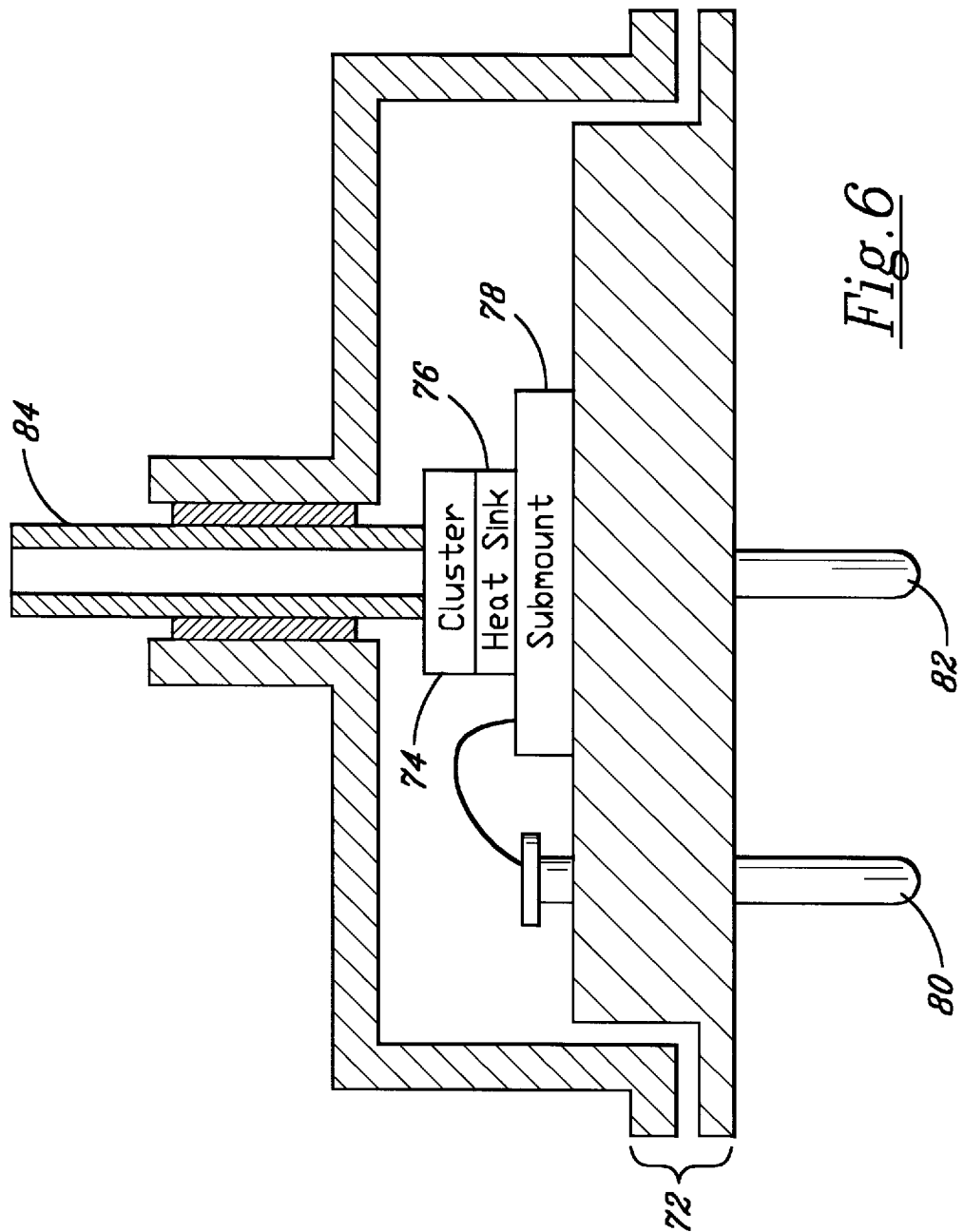
FIG. 6 is an elevational sectional view of the package depicted in FIG. 5.
Figure 7:
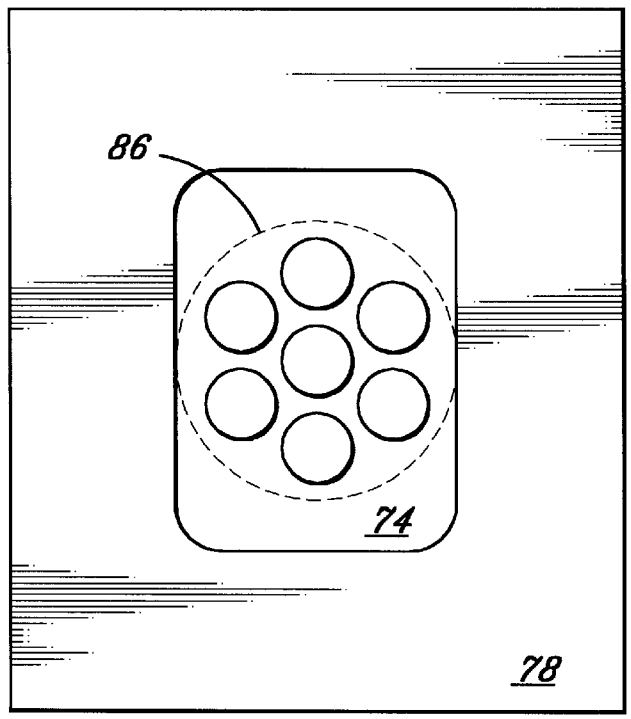
FIG. 7 is a plan view of the laser cluster in the package depicted in FIG. 6.

A commercial package for a high-power laser cluster is illustrated in FIG. 5. The package includes a housing 72. Referring to FIG. 6, the housing 72 seals a cluster 74 of VCSELs mounted on a heat sink 76, which is disposed on a submount 78 coupled to the housing. The cluster 74 includes a closely-spaced array of seven VCSELs, wherein each VCSEL is capable of emitting coherent electromagnetic radiation having a wavelength in a range from 950 nm to 1050 nm. Referring to FIG. 7, the VCSELs of the cluster 74 are positioned in a hexagonal closest-packing arrangement. The preferred spacing of the VCSELs in the cluster is in a range from 10 mm to 40 mm and the preferred diameter of the emitting facet of a VCSEL in the cluster is in a range from 5 mm to 30 mm. Referring to FIG. 6, common ground and ignition contacts 80, 82 pass through the sealed housing 72 and are electrically connected through the submount 78 and the heat sink 76 to the cluster 74. The common ground and ignition contacts 80, 82 are shared by the cluster 74 of VCSELs so that the VCSELs in the cluster operate in unison according to the principles of the invention.

In making the package, the cluster 74 of VCSELs is flipped and mounted junction-side (i.e., mesa side) down on the heat sink 76. After flipping, a backside emitting surface of the cluster 74 is exposed. Each VCSEL of the cluster emits upward through its substrate from its exposed bottom side. A metallized multimode optical fiber 84 passes through the housing 72 of the sealed package and is butt-coupled onto the backside emitting surface of the cluster 74 to receive laser emissions therefrom. Referring to FIG. 7, the VCSELs in the cluster 74 can be positioned within a circular area (see dashed circle 86) having a diameter which corresponds to the diameter of the core of the multimode optical fiber 84 (FIG. 6) which is butt-coupled to the backside emitting surface of the cluster 74. As an example, the circular area in which the cluster is positioned has a diameter of 100 mm which corresponds to the 100 mm-diameter core of the multimode optical fiber 84. This corresponding size relationship avoids facet damage during the fiber coupling and allows each VCSEL in the cluster 74 to be mounted junction-side down on the heat sink, according to the principles of the invention, for optimum heat sinking to further increase efficiency. Each VCSEL in the seven-VCSEL cluster 74 is electrically connected via an electrically conductive path through the heat sink 76 and submount 78 to the shared common ground and ignition contacts 80, 82.

Figure 8:
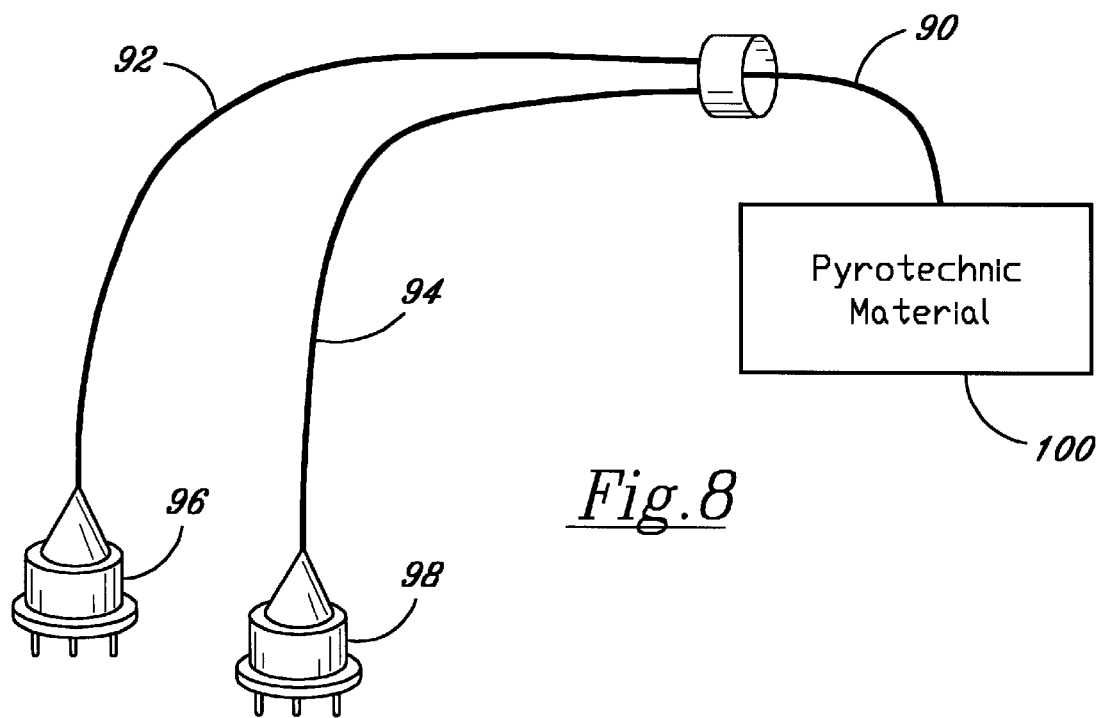
FIG. 8 is a schematic view of an optical energy transmission system according to the principles of the invention.

The high-power VCSEL cluster can be usefully embodied in an optical energy transmission system as a mechanism for igniting pyrotechnic materials for automobile and ordinance applications. In the optical energy transmission system depicted in FIG. 8, a pyrotechnic delivery fiber 90 is coupled to one or more multimode optical fibers 92, 94 integral with one or more associated packages 96, 98 of hexagonal closely-packed clusters of seven 20 mm-diameter VCSELs as previously described. Each cluster package output is passed through its integral multimode optical fiber to pyrotechnic delivery fiber 90, which can be used for igniting a pyrotechnic material 100.

The multi-laser cluster can also be made with multiple independent electrical contacts, instead of shared contacts, so that it is possible to have various power levels of operation without complex driver circuitry. This feature can also be used to operate only one VCSEL in a cluster for lower-power testing purposes.

While a particular form of the invention has been illustrated and described, it will be apparent that various modifications can be made without departing from the spirit and scope of the invention.

I claim:

1. A laser cluster for high-power applications, comprising:

an array of VCSELs including a center VCSEL and one or more peripheral VCSELs displaced from the center VCSEL; and a pair of common electrical contacts shared by said array of VCSELs;

wherein the VCSELs in said array are separated by a distance in a range from about 10 mm to about 40 mm.

2. A laser cluster for high-power applications, comprising:

an array of VCSELs including a center VCSEL and one or more peripheral VCSELs displaced from the center VCSEL; and a pair of common electrical contacts shared by said array of VCSELs;

wherein each VCSEL in said array presents an emitting facet having a diameter in a range from about 5 mm to about 30 mm.

3. A laser cluster as defined in claims 1 or 2, wherein:

each VCSEL in said array is mounted on a heat sink.

4. A laser cluster as defined in claims 1 or 2, further comprising:

a multimode optical fiber coupled to receive light emitted from said array.

5. A process of fabricating a laser cluster for high-power applications, comprising the following steps:

(A) providing an array of VCSELs in a hexagonal closest-packing arrangement;

(B) connecting the array of VCSELs to a pair of common electrical contacts; and (C) coupling the array of VCSELs into a multimode optical fiber;

wherein each VCSEL in the array presents an emitting facet having a diameter in a range from about 5 mm to about 30 mm, and the VCSELs in the array are separated by a distance in a range from about 10 mm to about 40 mm.

6. A process as defined in claim 5, further comprising the step:

mounting the array of VCSELs on a heat sink.

7. A process as defined in claim 5, wherein:

each VCSEL in the array is a bottom-emitting VCSEL, and further comprising the step of:

flip-chip mounting the array of VCSELs on a heat sink.

8. A package for a laser cluster, comprising:

a housing;

a submount in said housing;

a laser cluster including an array of VCSELs mounted junction-side down on said submount so that said laser cluster presents a backside emitting surface; and a multimode optical fiber including a core, said multimode optical fiber passing through said housing and coupled onto said backside emitting surface;

said laser cluster includes seven VCSELs positioned within a circular area, said circular area having a diameter which is substantially equal to the diameter of said core.

9. A package as defined in claim 8, further comprising:

common ground and ignition contacts which are electrically connected through said submount to said laser cluster.

10. A package as defined in claim 8, wherein:

each of said array of VCSELs is capable of emitting coherent electromagnetic radiation having a wavelength in a range from 950 nm to 1050 nm.

11. A package as defined in claim 8, wherein:

said submount includes aluminum nitride.

12. A process of fabricating a laser cluster for high-power applications, comprising the following steps:

(A) providing an array of VCSELs;

(B) connecting the array of VCSELs to a pair of common electrical contacts; and (C) coupling the array of VCSELs into a multimode optical fiber;

wherein each VCSEL in the array presents an emitting facet having a diameter in a range from about 5 mm to about 30 mm.

13. A process of fabricating a laser cluster for high-power applications, comprising the following steps:

(A) providing an array of VCSELs;

(B) connecting the array of VCSELs to a pair of common electrical contacts; and (C) coupling the array of VCSELs into a multimode optical fiber;

wherein the VCSELs in the array are separated by a distance in a range from about 10 mm to about 40 mm.

* * * * *